United States Patent
Abcarius et al.

(10) Patent No.: US 12,261,612 B2
(45) Date of Patent: Mar. 25, 2025

(54) COMPACT FREQUENCY-LOCKED LOOP ARCHITECTURE FOR DIGITAL CLOCKING

(71) Applicant: QUALCOMM Incorporated, San Diego, CA (US)

(72) Inventors: John Abcarius, San Diego, CA (US); Debesh Bhatta, San Diego, CA (US); Andrew Weil, San Diego, CA (US); Robert Martin Ondris, San Diego, CA (US); Wenjing Yin, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 200 days.

(21) Appl. No.: 18/177,445

(22) Filed: Mar. 2, 2023

(65) Prior Publication Data

US 2024/0297654 A1    Sep. 5, 2024

(51) Int. Cl.
*H03L 7/099*    (2006.01)
(52) U.S. Cl.
CPC .................. *H03L 7/0992* (2013.01)
(58) Field of Classification Search
CPC ..... H03L 7/0992; H03L 7/0802; H03L 7/093; H03L 7/143; H03L 7/181
See application file for complete search history.

(56) References Cited

U.S. PATENT DOCUMENTS 5,521,556 A * 5/1996 O'Shaughnessy ...... H03L 7/097
331/25
5,576,664 A * 11/1996 Herold .................... H03L 7/091
331/25
11,201,624 B2 * 12/2021 Haneda ................. H03M 1/201
(Continued)

OTHER PUBLICATIONS

Ding M., et al., "A 33-ppm/° C. 240-nW 40-nm CMOS Wakeup Timer Based on a Bang-Bang Digital-Intensive Frequency-Locked-Loop for IoT Applications", IEEE Transactions on Circuits and Systems I: Regular Papers, IEEE, US, vol. 67, No. 7, Jul. 1, 2020, pp. 2263-2273, XP011795905, paragraph [0001]—paragraph [00VI], Figures 1-22.

(Continued)

*Primary Examiner* — Jeffrey M Shin
(74) *Attorney, Agent, or Firm* — Patterson & Sheridan LLP (57) ABSTRACT

Certain aspects of the present disclosure provide a relatively compact frequency-locked loop (FLL) using a discrete-time integrator. For certain aspects, the FLL also includes a supplemental oscillator and other circuitry that allows for saving the FLL frequency when a reference clock will be disconnected, maintaining a similar frequency during disconnection, and restoring the FLL frequency when the reference clock is reconnected. One example FLL circuit generally includes: an encoder; a combiner comprising a first input coupled to an output of the encoder; a digital-to-analog converter (DAC) comprising an input coupled to an output of the combiner; a discrete-time integrator comprising an input coupled to an output of the DAC; a voltage-controlled oscillator (VCO) comprising a control input coupled to an output of the discrete-time integrator; and a counter comprising an input coupled to an output of the VCO and comprising an output coupled to a second input of the combiner.

29 Claims, 8 Drawing Sheets

(56) References Cited

U.S. PATENT DOCUMENTS 11,831,314 B1 * 11/2023 del Cesta ............. H03K 3/0315
2013/0005276 A1 1/2013 Van Driest

OTHER PUBLICATIONS

Gurleyuk C., et al., "A 16 MHz CMOS RC Frequency Reference With ±90 ppm Inaccuracy From -45° C. to 85° C.", IEEE Journal of Solid-state Circuits, IEEE, USA, vol. 57, No. 8, Aug. 1, 2022, pp. 2429-2437, XP011915261, paragraph [0001]—paragraph [000V], figures 1-14.
International Search Report and Written Opinion—PCT/US2024/017008—ISA/EPO—Jul. 24, 2024.
Khalil W., et al., "A 700-µA 405-MHz All-Digital Fractional-N Frequency-Locked Loop for ISM Band Applications", IEEE Transactions on Microwave Theory and Techniques, IEEE, USA, vol. 59, No. 5, May 1, 2011, pp. 1319-1326, XP011321762, paragraph [0001]—paragraph [000V], Figures 1-12.
Bax W.T., et al., "A Σ•Δ Frequency Discriminator Based Synthesizer", in Proceedings International Symposium Circuits Systems, May 1995, vol. 1, pp. 1-4.

* cited by examiner

COMPACT FREQUENCY-LOCKED LOOP ARCHITECTURE FOR DIGITAL CLOCKING

TECHNICAL FIELD

Certain aspects of the present disclosure generally relate to electronic circuits and, more particularly, to frequency-locked loops (FLLs).

BACKGROUND

A frequency-locked loop (FLL) is an electronic control circuit used to generate an oscillating signal that is locked to the frequency of a reference signal. An FLL typically includes a voltage-controlled oscillator (VCO) or a digitally controlled oscillator (DCO) that outputs a tunable oscillating signal, and the FLL compares the frequency of the tunable oscillating signal to the frequency of the reference signal, automatically controlling the VCO or DCO to increase or decrease the frequency of the oscillating signal such that this frequency (but not necessarily the phase) matches the frequency of the reference signal. FLLs may be used in any of various applications to generate one or more signals with stable frequencies. These applications may include computers and telecommunications (e.g., wireless communications).

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide advantages that include reduced area occupied by a frequency-locked loop (FLL) and reduced jitter.

Certain aspects of the present disclosure provide a FLL circuit. The FLL circuit generally includes: an encoder; a combiner comprising a first input coupled to an output of the encoder; a digital-to-analog converter (DAC) comprising an input coupled to an output of the combiner; a discrete-time integrator comprising an input coupled to an output of the DAC; a voltage-controlled oscillator (VCO) comprising a control input coupled to an output of the discrete-time integrator; and a counter comprising an input coupled to an output of the VCO and comprising an output coupled to a second input of the combiner.

Certain aspects of the present disclosure provide a circuit for generating an oscillating signal. The circuit generally includes: an FLL including a DAC, a discrete-time integrator having an input coupled to an output of the DAC, and a VCO having a control input coupled to an output of the discrete-time integrator; a reference clock generator selectively coupled to one or more clock inputs of the FLL; and an oscillator selectively coupled to the one or more clock inputs of the FLL.

Certain aspects of the present disclosure provide a method of signal generation. The method generally includes: receiving, at an input of a counter, an output signal from a VCO; determining, via the counter, a counter output signal representing a frequency of the output signal; determining, via a combiner, an error signal based on a difference between a target frequency and the frequency of the output signal; generating, via a DAC, an analog signal based on the error signal; generating, via a discrete-time integrator, a control voltage by integrating the analog signal; and controlling the VCO via the control voltage.

Certain aspects of the present disclosure provide an apparatus for signal generation. The apparatus generally includes means for determining a frequency indication signal representing a frequency of an output signal from a VCO; means for determining an error signal based on a difference between a target frequency and the frequency of the output signal; means for generating an analog signal based on the error signal; and means for generating a control voltage, the means for generating the control voltage including means for integrating the analog signal in discrete time, the VCO being controlled via the control voltage.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure are directed toward a relatively compact frequency-locked loop (FLL).

Conventional FLLs use digital-to-analog conversion circuitry that consumes a large amount of area on a circuit board to provide fine resolution and a wide range for the FLL. Certain aspects of the present disclosure provide an FLL implemented with a digital-to-analog converter (DAC) for generating an analog signal and a discrete-time integrator to integrate the generated analog signal. The discrete-time integrator may generate a control voltage for driving the FLL's voltage-controlled oscillator (VCO). In this manner, the DAC may be implemented with fewer bits than conventional implementations, allowing the DAC to be smaller in size. For certain aspects, the FLL also includes a supplemental oscillator and other circuitry that allows for saving the FLL frequency when a reference clock will be disconnected, maintaining a similar frequency during disconnection, and restoring the FLL frequency when the reference clock is reconnected.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

Example Frequency-Locked Loop

Figure 1:
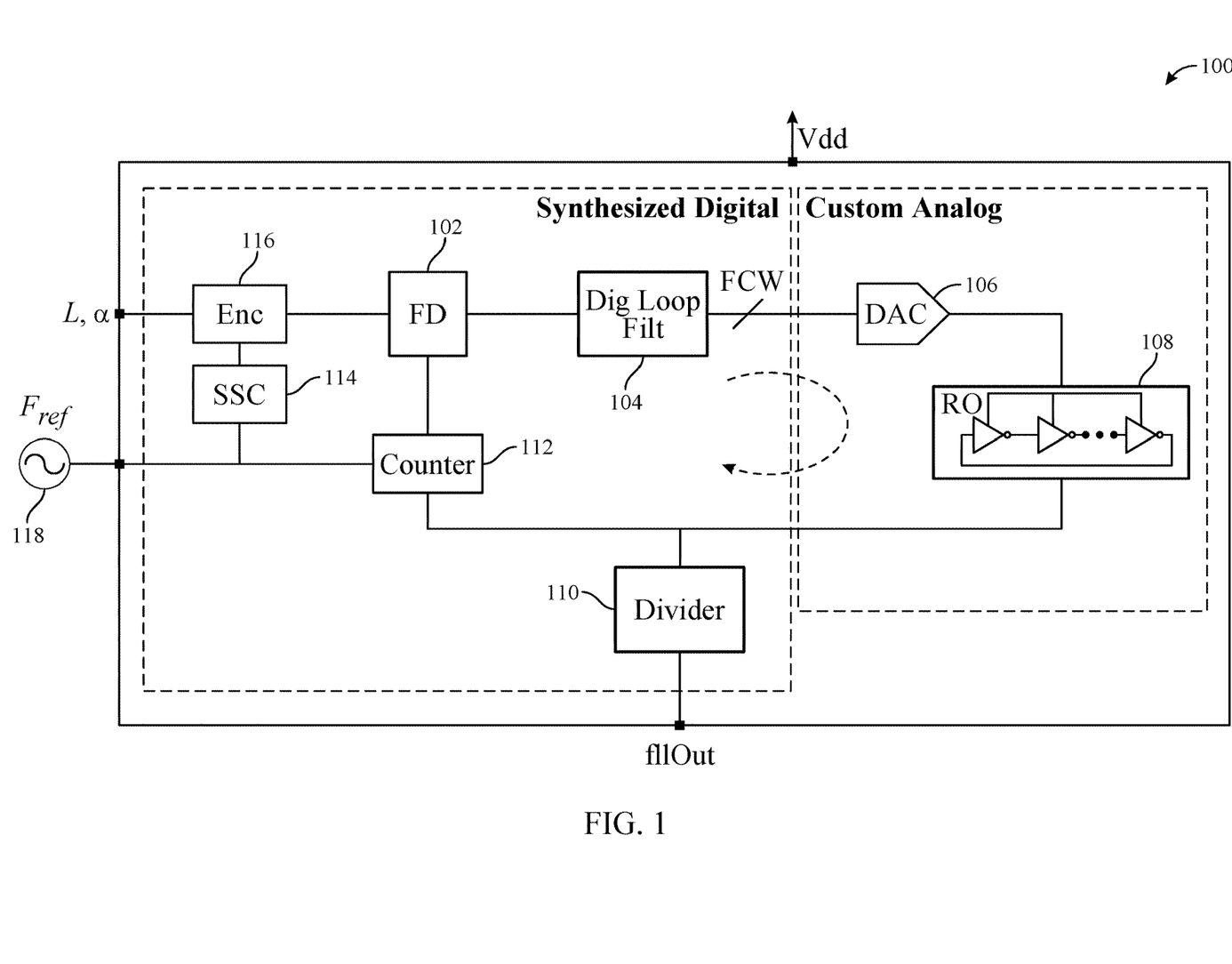
FIG. 1 is a block diagram of an example frequency-locked loop, in which aspects of the present disclosure may be practiced.

FIG. 1 illustrates an example frequency-locked loop (FLL) 100, in which aspects of the present disclosure may be practiced. In some aspects, the FLL 100 may be used in a frequency synthesizer to generate an oscillating signal for clocking digital circuitry. However, the FLL 100 may be used to generate an oscillating signal for any suitable application.

The FLL 100 includes a frequency detector (FD) 102, a digital loop filter 104 (labeled "Dig Loop Filt"), a digital-to-analog converter (DAC) 106, a voltage-controlled oscillator (VCO) 108, a frequency divider 110, a counter 112, a spread spectrum clock (SSC) generator 114, and an encoder 116 (labeled "Enc"). As shown, the FD 102, digital loop filter 104, frequency divider 110, counter 112, SSC generator 114, and encoder 116 are implemented in the digital domain, whereas the DAC 106 and VCO 108 are implemented in the analog domain. For other aspects, the frequency divider 110 may be implemented in the analog domain, rather than in the digital domain. The FLL 100 may be coupled to a reference oscillator 118, which may be implemented by a crystal oscillator (XO), for example. The reference oscillator 118 may generate a reference frequency oscillating signal ($F_{ref}$) for the FLL 100.

Although the VCO 108 may be implemented as a ring oscillator (RO), as shown in FIG. 1, the VCO may be implemented by any suitable oscillator circuit with an adjustable output frequency. As illustrated, the VCO 108 is coupled to the counter 112 and may provide a feedback signal to the counter 112. The feedback signal may represent the oscillating signal generated by the VCO 108, or a frequency-divided version thereof. The counter 112 may determine the number of clock cycles of the feedback signal that occur in one cycle of the reference frequency signal ($F_{ref}$) provided to the counter 112. The counter 112 may generate a counter output signal indicating the number of clock cycles to the FD 102. The FD 102 may also receive a target count signal from the encoder 116. For example, the encoder 116 may receive a set of target values at which the FLL 100 is to operate. The set of target values indicates a target frequency of the oscillating signal generated by the VCO 108, based on the reference frequency. The set of target values may include an integer value L and a fractional value α, where the output frequency ($F_{out}$) of the VCO is targeted to meet the following equation:

$$F_{out} = (L + \alpha) \times F_{ref}$$

The SSC generator 114 may be coupled to the reference oscillator 118 and may generate a spread spectrum clock from the reference frequency signal ($F_{ref}$). The encoder 116 may receive the spread spectrum clock from the SSC generator 114 and may, in turn, generate the target count signal to be provided to the FD 102. The FD 102 may compare the counter output signal received from the counter 112 to the target count signal and output an error signal. The error signal indicates a difference between the actual frequency of the oscillating signal generated by the VCO 108 and the target frequency for the FLL 100. The FD 102 may provide the error signal to the digital loop filter 104 to be processed for generating a multi-bit frequency control word (FCW). The DAC 106 may then convert the FCW to an analog signal which is used to control the VCO 108 to adjust its output frequency, thereby completing the loop to lock the VCO's output frequency to the target frequency. Optionally, the output of the VCO 108 may be frequency divided using the frequency divider 110 to generate an FLL output signal (labeled "fllOut").

Figure 2A:
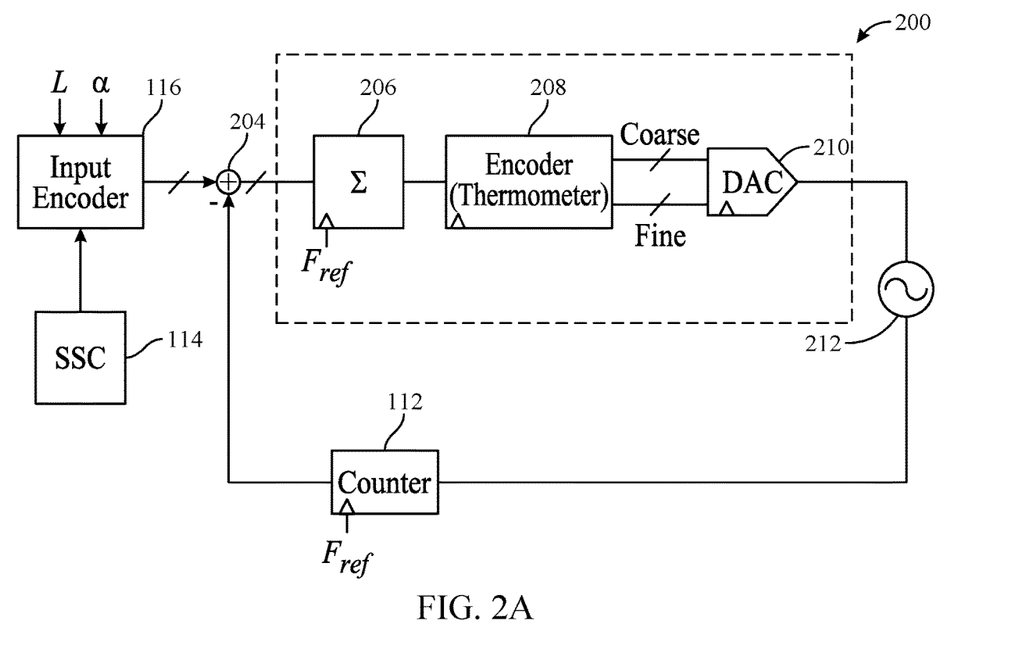
FIG. 2A is a block diagram of an example frequency-locked loop using an accumulator and an encoder.

FIG. 2A is a block diagram of an example FLL 200, in which aspects of the present disclosure may be practiced. The FLL 200 may include an SSC generator 114, an input encoder 116, a combiner 204, an accumulator 206, an encoder 208, a DAC 210, a VCO 212, and a counter 112. As illustrated, a feedback signal may be received by counter 112. The feedback signal may represent the oscillating signal generated by the VCO 212 (e.g., corresponding to VCO 108). The counter 112 may have a first input coupled to an output of the VCO 212 and a second input configured to receive the reference frequency signal ($F_{ref}$). As described above, the counter 112 may determine the number of clock cycles of the feedback signal in one cycle of $F_{ref}$. The counter 112 may generate a counter output signal indicating the number of clock cycles to the combiner 204 (e.g., corresponding to the FD 102). The combiner 204 may also receive a target count signal from the input encoder 116, as described above with respect to FIG. 1.

The combiner 204 may compare the counter's output signal to the target count signal and output an error signal. The error signal is provided to the input of the accumulator 206. The accumulator 206 generates an accumulated error signal which is supplied to the encoder 208 (e.g., a thermometer encoder) for generating coarse and fine digital inputs to the DAC 210 (e.g., corresponding to DAC 106 of FIG. 1). The DAC 210 generates an analog control signal for controlling the VCO 212. The DAC 210 may be designed with a high nominal resolution (e.g., the specified number of bits) for the FLL. For example, the nominal bit resolution of the DAC 210 may be greater than or equal to twelve bits. As a result, the DAC 210 may occupy a large area and may dominate the size of the FLL 200.

Example Frequency-Locked Loop with a Discrete-Time Integrator

Certain aspects of the present disclosure provide an FLL with reduced area consumption and decreased low frequency jitter compared to conventional implementations. For example, certain aspects provide an FLL implemented using a discrete-time integrator (e.g., a switched-capacitor integrator). With the integrator, a DAC with a low nominal bit resolution (e.g., a 1-bit DAC) may be used, resulting in reduced area consumption compared to FLL 100 or FLL 200. The discrete-time integrator may integrate the output of the small-bit DAC to generate a control signal for the VCO.

Figure 2B:
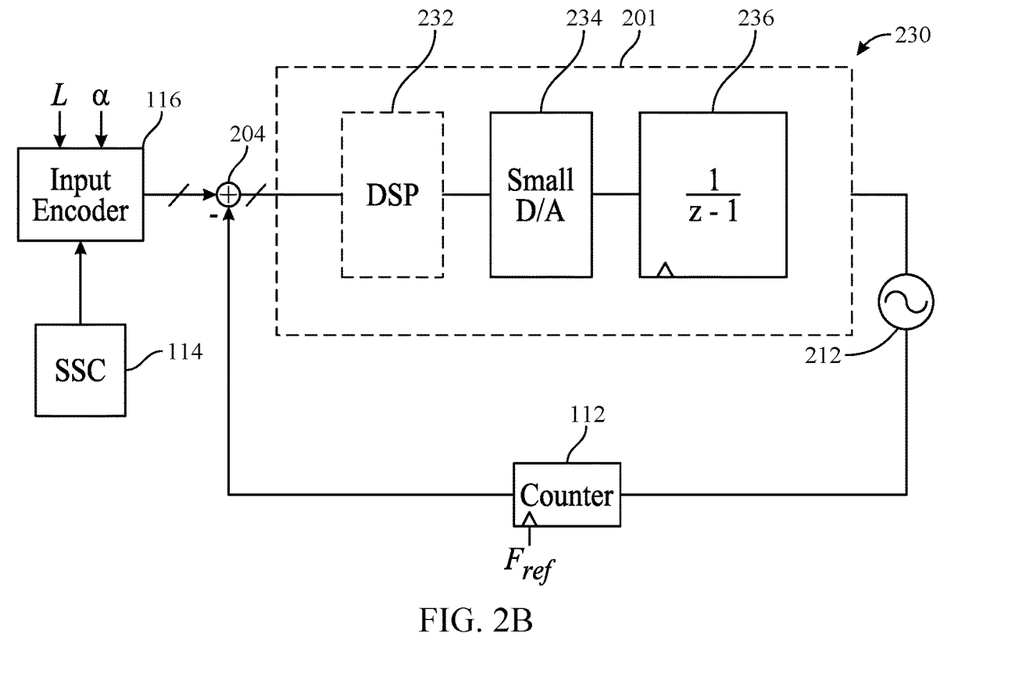
FIG. 2B is a block diagram of an example frequency-locked loop that includes a discrete-time integrator, in accordance with certain aspects of the present disclosure.

FIG. 2B illustrates an example FLL 230, in accordance with certain aspects of the present disclosure. The FLL 230 includes processing circuitry 201 having a DAC 234 and a discrete-time integrator 236. In some aspects, the processing circuitry 201 may optionally include digital logic, such as a digital signal processor (DSP) 232. The DSP 232 may process the error signal from the combiner 204, as described in more detail herein. The DAC 234 may receive the error signal generated by the combiner 204 (or a processed version thereof via the DSP 232).

DAC 234 may have a smaller nominal bit resolution than DAC 210 or DAC 106, allowing the DAC 234 to have a smaller area as compared to DAC 210 or DAC 106. For example, the DAC 234 may have a nominal bit resolution of 5 bits or less (e.g., 3 bits or 1 bit). In the case of a 1-bit DAC, the DAC 234 may be implemented by a charge pump, for example. The DAC 234 converts the received error signal to an analog signal, which is provided to the discrete-time integrator 236. The discrete-time integrator 236 integrates the analog signal, forming a control signal used to control the VCO 212. The discrete-time integrator 236 may have a transfer function that is inversely proportional to z−1 in the z domain, as illustrated.

Figure 3A:
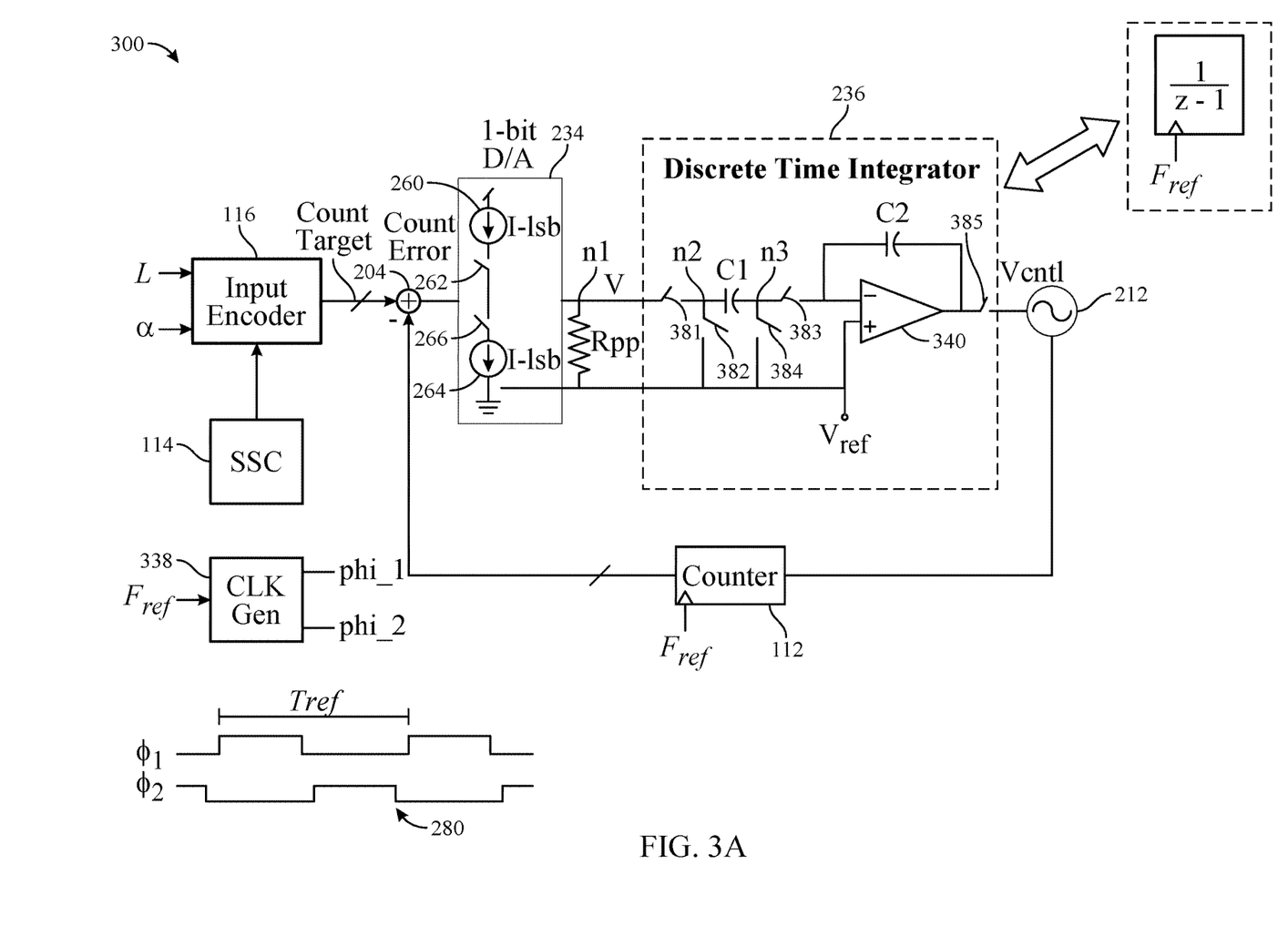
FIG. 3A is a block diagram of an example frequency-locked loop circuit using a switched-capacitor integrator, in accordance with certain aspects of the present disclosure.

FIG. 3A is a block diagram of an example FLL circuit 300, in accordance with certain aspects of the present disclosure. As shown in FIG. 3A, the DAC 234 may be implemented as a 1-bit DAC. In some aspects, such a 1-bit DAC may be implemented using a charge pump circuit, as shown in FIG. 3A. The discrete-time integrator 236 may be implemented as a switched-capacitor integrator, in some aspects, as depicted in FIG. 3A, although any suitable discrete-time integrator circuit may be used. By using an integrator of discrete-time nature, the desired loop dynamics (e.g., bandwidth dependencies) of the original FLL (FIG. 2A) can be preserved. This is because the discrete-time integrator 236 shown in FIG. 2B may be designed to have the same transfer function as the accumulator 206 of FIG. 2A.

Based on the count error signal generated by the combiner 204, the DAC 234 may source current to node n1 using current source 260 by closing switch 262 or sink current from node n1 using current source 264 by closing switch 266. By sourcing and sinking currents from node n1, a voltage V is generated at node n1 (e.g., across resistive element Rpp). For example, if the combiner 204 generates a positive error signal (e.g., indicating that the frequency of the VCO's oscillating signal is too low), the DAC 234 may source current to node n1, generating a positive voltage at node n1 with respect to a reference potential node (e.g., electric ground). In contrast, if the combiner 204 generates a negative error signal (e.g., indicating that the frequency of the VCO's oscillating signal is too high), the DAC 234 sinks current from node n1, generating a negative voltage at node n1 with respect to the reference potential node.

The discrete-time integrator 236 may receive and integrate the voltage V at node n1 to generate the control voltage (Vcntl) to be used to control the VCO 212. As a switched-capacitor integrator, the discrete-time integrator 236 may include a first switch 381, a second switch 382, a third switch 383, a fourth switch 384, a fifth switch 385, a first capacitive element C1, a second capacitive element C2, and an amplifier 340.

The second capacitive element C2 may be coupled between the output and the negative input terminal of amplifier 340. The positive terminal (also referred to herein as a positive input) of amplifier 340 may be coupled to the reference potential node (e.g., electric ground). A first terminal of the first capacitive element C1 may be coupled to node n1 through the first switch 381. The second terminal of the first capacitive element C1 may be coupled to the negative terminal (also referred to herein as a negative input) of the amplifier 340 through the third switch 383. The second switch 382 may be coupled between the first terminal of the first capacitive element C1 at node n2 and the positive input of the amplifier (or the reference potential node). The fourth switch 384 may be coupled between the second terminal of the first capacitive element C1 at node n3 and the reference potential node. The fifth switch 385 may be coupled between the output of the amplifier 340 and the input of the VCO 212.

The discrete-time integrator 236 may be controlled by non-overlapping clock signals 280, implementing a sampling phase ($\Phi_1$) and a charge transfer phase ($\Phi_2$). The sampling phase and the charge transfer phase may occur during each cycle of $F_{ref}$ (e.g., during each period of $F_{ref}$ shown as $T_{ref}$ in FIG. 3A). Each of the switches may be controlled by clock signals phi_1 and phi_2 provided by a clock generator 338 (labeled "CLK Gen") that generates the clock signals phi_1 and phi_2 based on $F_{ref}$. The first switch 381, the fourth switch 384, and the fifth switch 385 may be controlled by clock signal phi_1. The second switch 382 and the third switch 383 may be controlled by clock signal phi_2.

During the sampling phase ($\Phi_1$), phi_1 is logic high, and phi_2 is logic low, such that the first switch 381, the fourth switch 384, and the fifth switch 385 are closed, while the second switch 382 and the third switch 383 are open. During the sampling phase, the voltage V at node n1 is sampled (e.g., stored in first capacitive element C1). After sampling the voltage V at node n1, the clock generator 338 switches phi_1 to logic low and phi_2 to logic high to begin the charge transfer phase ($\Phi_2$), such that the first switch 381, the fourth switch 384, and the fifth switch 385 are open, and the second switch 382 and the third switch 383 are closed. During the charge transfer phase, the charge stored in the first capacitive element C1 is transferred to the second capacitive element C2. After the charge transfer phase, another sampling phase begins, during which the second capacitive element C2 is coupled to the VCO, generating the control voltage (Vcntl) used to control the VCO 212. In this manner, Vcntl is increased or decreased based on the voltage V at node n1.

For example, suppose the error signal is positive. In that case, the voltage V may be increased by a voltage corresponding to the resolution of the DAC 234 (e.g., the resolution associated with one bit of a 1-bit DAC, or with the least significant bit (LSB) of the DAC if a multi-bit DAC is used). The voltage V is then integrated, resulting in a corresponding increase of Vcntl. On the other hand, if the error signal is negative, the voltage V may be decreased by a voltage corresponding to the resolution of the DAC 234. The voltage V is then integrated, resulting in a corresponding decrease of Vcntl. Thus, the frequency of the oscillating signal generated by the VCO 212 is adjusted within the frequency range of the VCO and with a resolution corresponding to the resolution of the DAC 234.

Figure 3B:
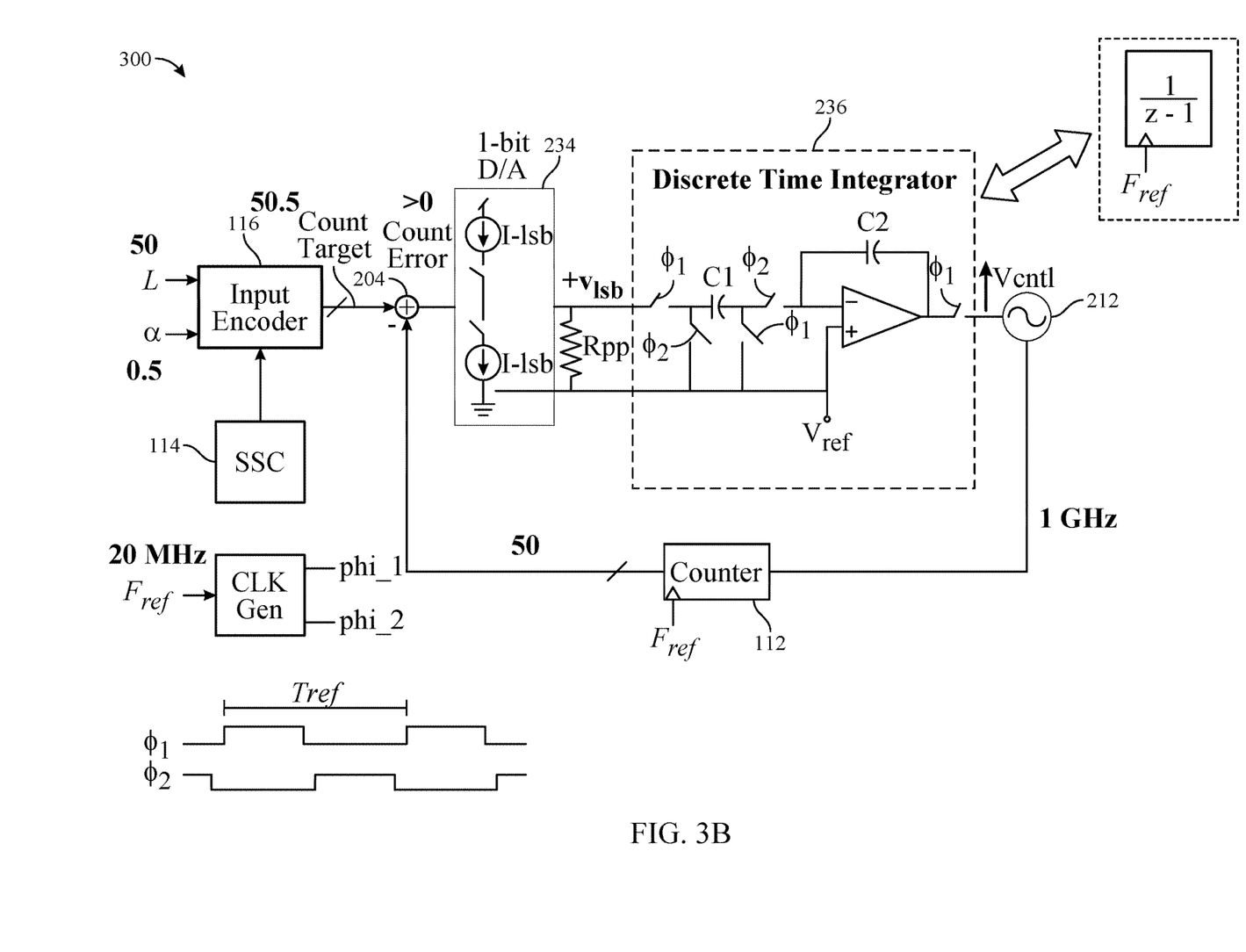
FIG. 3B illustrates example operation of the frequency-locked loop circuit of FIG. 3A.

FIG. 3B provides example values to facilitate understanding of the operation of the FLL circuit 300 of FIG. 3A. As shown, the current output frequency of the VCO 212 may be equal to 1 GHz, and the frequency of $F_{ref}$ may be equal to 20 MHz, resulting in a count signal (e.g., at the output of the counter 112) corresponding to a count value of 50. The set of target values may include a value L of 50 and a fractional value a of 0.5, resulting in a target count value of 50.5 corresponding to a target frequency of 1010 MHz (e.g., 1.01 GHz).

As shown, the combiner 204 may receive the count signal from the counter 112, corresponding to the feedback count value of 50. The combiner 204 may also receive the target count signal from the encoder 116 corresponding to the target count value of 50.5. Because the target count value of 50.5 is greater than the feedback count value of 50, the error signal generated by the combiner 204 is positive (i.e., the count error is >0). Thus, the combiner provides a positive value to the DAC 234. Based on the positive value from the combiner 204, the DAC 234 sources current to node n1. Thus, the voltage V at node n1 is increased (e.g., by an amount equal to the resolution of the DAC 234). The voltage V is then integrated by the discrete-time integrator 236, and voltage Vcntl is increased accordingly, resulting in an increase of the frequency of the oscillating signal at the output of the VCO. This process continues in the frequency-locked loop to maintain the oscillating signal frequency at the target frequency represented by L and α.

Figure 3C:
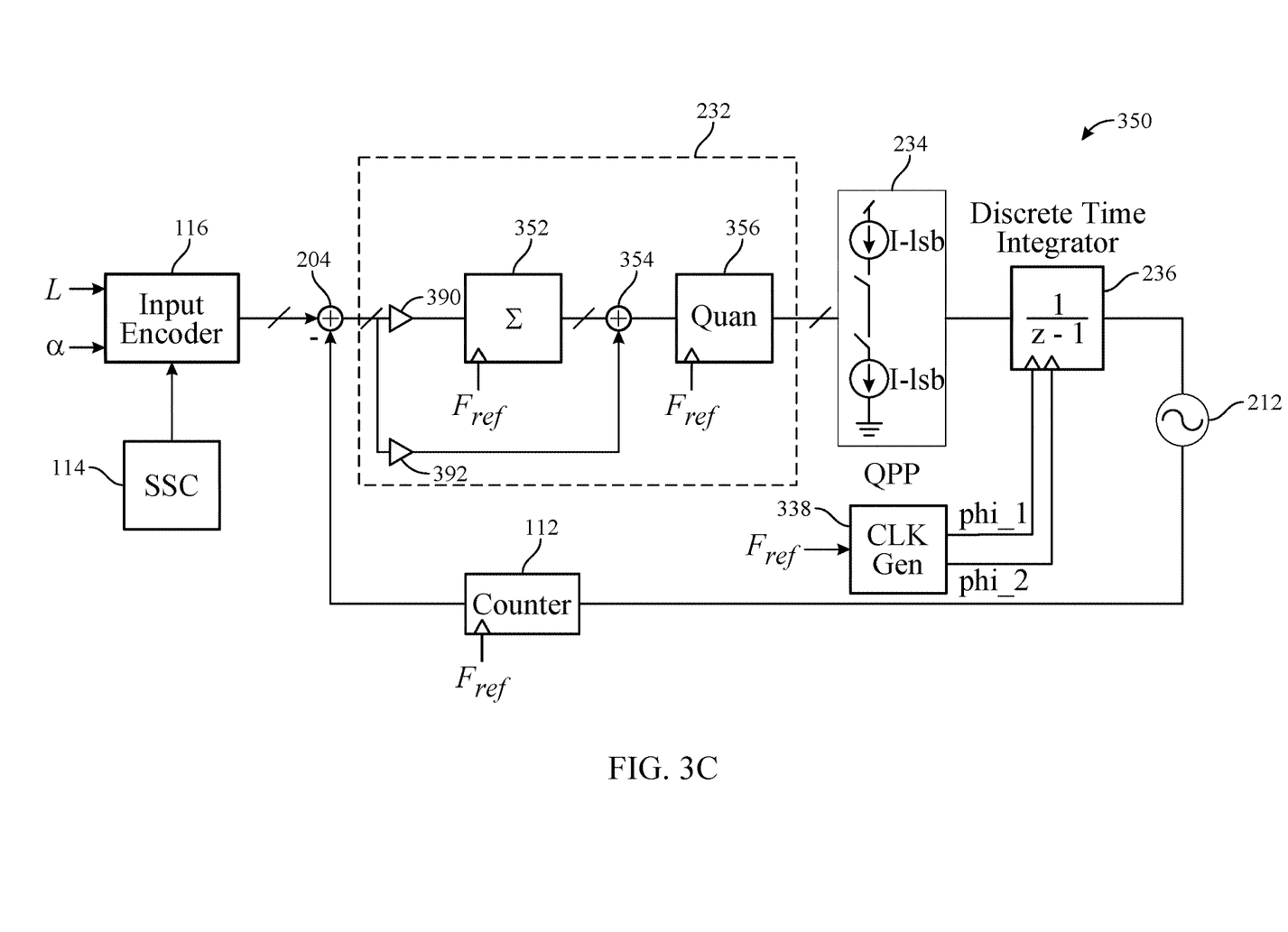
FIG. 3C is a block diagram of an example frequency-locked loop circuit having a digital signal processor, in accordance with certain aspects of the present disclosure.

FIG. 3C is a block diagram of an example FLL circuit 350 including a DSP 232, in accordance with certain aspects of the present disclosure. The DSP 232 may be used to compensate for (or at least reduce) an error (e.g., a frequency offset) associated with the discrete-time integrator 236. In other words, a certain amount of error (or drift) may be associated with the analog circuitry used to implement the discrete-time integrator 236. This error may be reduced using the DSP 232, increasing the accuracy of the FLL circuit 350.

The DSP 232 may include a coefficient multiplier stage 390 (with a coefficient kpi) (e.g., a gain stage), a coefficient multiplier stage 392 (with a coefficient kpp), combiner 354, and an optional quantizer 356 (labeled "Quant") (e.g., a re-quantizer with a multi-bit output). The DSP 232 may be implemented as a proportional-plus-integral (PPI) path controller, in some aspects. As shown, the output of the combiner 204 is provided to the coefficient multiplier stage 390 and the coefficient multiplier stage 392. The output of the coefficient multiplier stage 390 is provided to a digital accumulator 352. The digital accumulator 352 accumulates and stores the error signal at the output of the coefficient multiplier stage 390, in effect storing an offset used to compensate (or at least reduce) an error (e.g., drift) associated with the discrete-time integrator 236. The output of the digital accumulator 352 and the output of the coefficient multiplier stage 392 may be provided to a combiner 354. The combiner 354 then generates an error signal that is provided to the DAC 234. In some aspects, the combiner 354 provides the error signal to an optional quantizer 356, which re-quantizes the digital error signal, generating a re-quantized error signal with fewer bits than the error signal at the output of the combiner 354.

Using a 1-bit DAC for the DAC 234 may result in a slow slew rate for the FLL. The slew rate may refer to the maximum rate of change of the frequency of the oscillating signal at the output of the VCO. In some aspects of the present disclosure, a multi-bit DAC may be used for the DAC 234 to increase the slew rate for the FLL. For example, a 5-bit or a 3-bit DAC may be used in some scenarios.

Example State Freeze and Restore for FLL with Discrete-Time Integrator

Figure 4:
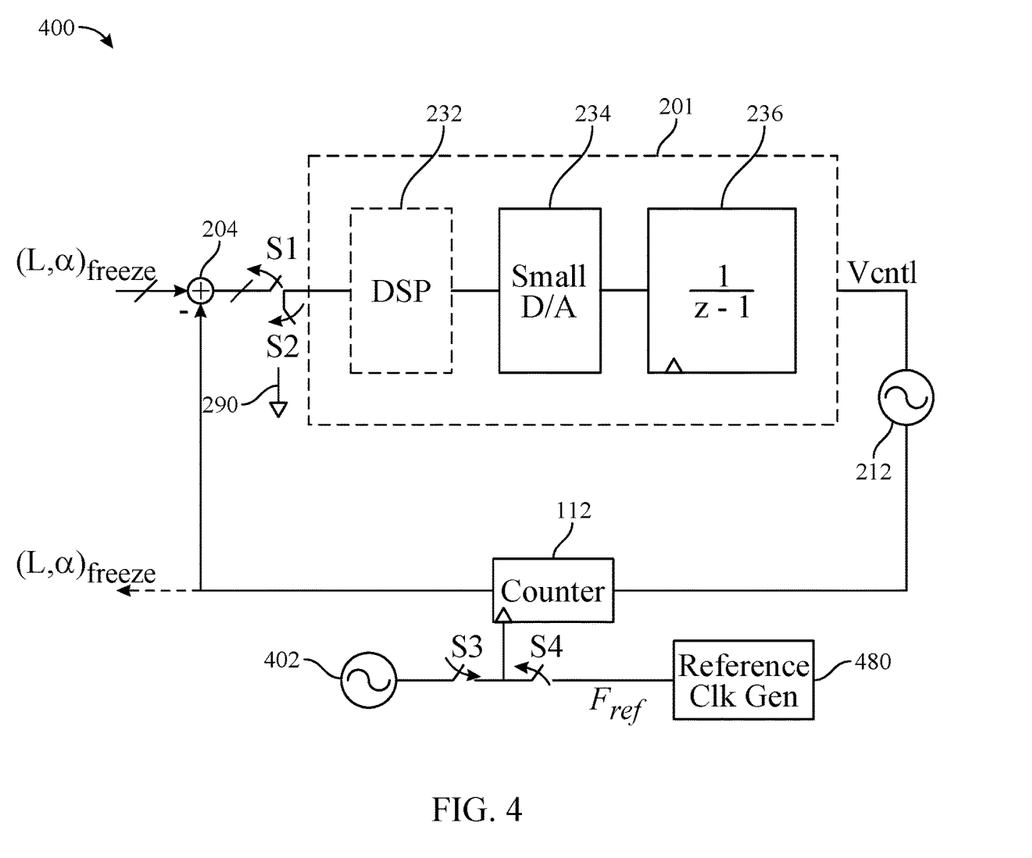
FIGS. 4 and 5 are block diagrams of an example frequency-locked loop circuit having circuitry for switching reference frequency signals, in accordance with certain aspects of the present disclosure.

In some cases, the reference frequency signal ($F_{ref}$) may be removed or otherwise made effectively unavailable to the FLL, temporarily. Certain aspects of the present disclosure provide techniques and apparatus to preserve the FLL frequency when $F_{ref}$ is removed. In this manner, the FLL operating frequency may be saved before $F_{ref}$ is removed, a similar frequency may be maintained by the FLL during removal, and the prior FLL operating frequency may be restored when $F_{ref}$ returns FIG. 4 is a block diagram of an example FLL circuit 400 implemented with an oscillator 402 (also referred to herein as a "supplemental oscillator"), in accordance with certain aspects of the present disclosure. The oscillator 402 may be simpler, less accurate, less stable, and/or less costly than the reference oscillator 118. For example, the oscillator 402 may be implemented as a resistor-capacitor oscillator (RCO), although any suitable oscillator may be used. The oscillator 402 may generate an oscillating signal with a frequency roughly equal to the frequency of $F_{ref}$ (e.g., the same frequency within a 25% tolerance). The oscillating signal generated by the oscillator 402 may be used to operate the FLL circuit 400 when $F_{ref}$ is not being provided to the FLL circuit 400.

As illustrated, a first switch S1 may be coupled between the combiner 204 and the processing circuitry 201. A second switch S2 may be coupled between the output of S1 and a digital zero node 290 (e.g., a node providing a digital signal representing a digital value of zero). For certain aspects, switches S1 and S2 may be implemented by a multiplexer (not shown in FIG. 4). A third switch S3 may be coupled between the output of the oscillator 402 and a clock input of the counter 112. A fourth switch S4 may be coupled between a reference clock generator 480 (e.g., the reference oscillator 118, which may be a crystal oscillator) used to provide $F_{ref}$ and the clock input of the counter 112. For certain aspects, switches S3 and S4 may be implemented by one or more multiplexers (not shown in FIG. 4).

Switch S3 may be open, and S4 may be closed, while $F_{ref}$ is available and used to operate the FLL circuit 400. An input may be received indicating that $F_{ref}$ is to be removed. In response, the oscillating signal generated by oscillator 402 may be used to "freeze" (capture and store) a current state of the FLL (e.g., configure the FLL circuit 400 in a freeze state). For example, switch S1 may be opened, and switch S2 may be closed. Thus, the input to the processing circuitry 201 may be coupled to the digital zero node 290. As a result, the discrete-time integrator 236 may maintain a current voltage of Vcntl. Switch S4 may then be opened, disconnecting the reference clock generator 480 providing $F_{ref}$ from the FLL circuit 400. Switch S3 may then be closed, connecting the oscillator 402 to the FLL circuit. At this stage, the FLL circuit 400 determines a set of target values $L_{freeze}$ and $\alpha_{freeze}$ for the freeze state using the oscillating signal generated by the oscillator 402, as described in more detail herein. Once $L_{freeze}$ and $\alpha_{freeze}$ are determined, $L_{freeze}$ and $\alpha_{freeze}$ may be stored (e.g., in a register) and used to generate the target count signal provided to the combiner 204.

Switch S1 may then be closed, and switch S2 may be opened, reconnecting the processing circuitry 201 to the output of the combiner 204. The combiner 204 generates an error signal based on the target count signal (e.g., based on $L_{freeze}$ and $\alpha_{freeze}$). Vcntl is generated by the discrete-time integrator 236 based on the error signal to maintain the frequency of the oscillating signal at the output of the VCO 212 (e.g., during the remainder of the freeze state). In other words, the FLL circuit can maintain operation at a stable target frequency while $F_{ref}$ is removed.

Figure 5:
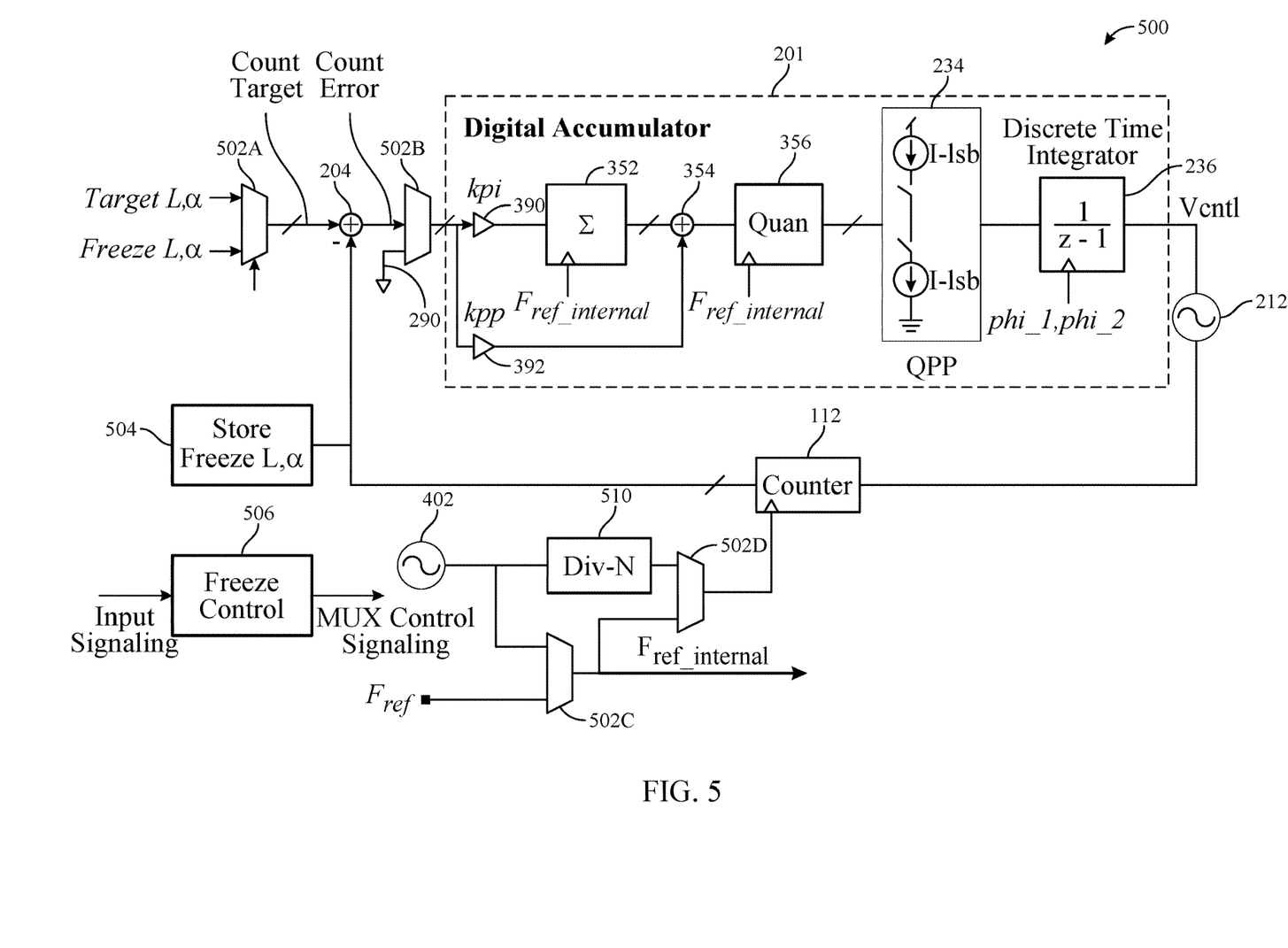

When $F_{ref}$ is reconnected to the FLL circuit, switch S3 may be opened, and switch S4 may be closed. The original (or new) L and $\alpha$ values may be used, instead of the $L_{freeze}$ and $\alpha_{freeze}$ values. In this manner, the FLL circuit may quickly reacquire frequency lock FIG. 5 is a block diagram of an example FLL circuit 500 implementing a freeze state, in which aspects of the present disclosure may be practiced. As shown, the FLL circuit 500 includes multiple multiplexers (MUXs), including MUX 502A, MUX 502B, MUX 502C, and MUX 502D. The FLL circuit 500 may also include a register 504 for storing FLL control parameters (e.g., $L_{freeze}$ and $\alpha_{freeze}$) for the freeze state. The FLL circuit 500 may further include a control circuit 506 (labeled "Freeze Control") configured to control each of the multiplexers.

MUX 502A may be configured to receive the set of target values (L and $\alpha$) for normal (e.g., non-freeze state) FLL operation and the set of target values for freeze state operation (e.g., $L_{freeze}$ and $\alpha_{freeze}$). Based on a control signal from the control circuit 506, MUX 502A provides $L_{freeze}$ and $\alpha_{freeze}$ to combiner 204 or provides L and a to combiner 204. MUX 502B may have a first input coupled to the output of the combiner 204 and a second input coupled to the digital zero node 290. An output of MUX 502B may be coupled to the input of the processing circuitry 201 (e.g., to the coefficient multiplier stage 390 and the coefficient multiplier stage 392).

MUX 502C may be configured to receive an oscillating signal from oscillator 402 at a first input and $F_{ref}$ (e.g., from reference clock generator 480) at a second input. MUX 502C, based on MUX control signaling from the control circuit 506, may output either $F_{ref}$ or the oscillating signal from oscillator 402. The output signal of MUX 502C (e.g., $F_{ref\_internal}$) may be provided to and used to operate the digital accumulator 352, the quantizer 356, and the discrete-time integrator 236 (e.g., through the clock generator 338).

In some aspects, a frequency divider 510 may be coupled between an output of the oscillator 402 and a first input of MUX 502D, a second input of MUX 502D being coupled to an output of MUX 502C. The frequency divider 510 may divide the frequency of the output signal of oscillator 402 by N, N being any integer greater than 1. The frequency of the signal from oscillator 402 may be divided to increase the measurement accuracy of $L_{freeze}$ and $\alpha_{freeze}$, as described in more detail herein. MUX 502D may generate a clock signal for operating the counter 112. For example, MUX 502D may either output the frequency-divided signal from the frequency divider 510 or $F_{ref\_internal}$ to the clock input of the counter 112.

When in normal operation (e.g., operating using $F_{ref}$), MUX 502C outputs $F_{ref}$ to the second input of MUX 502D, and MUX 502D outputs $F_{ref}$ to the counter 112. $F_{ref}$ is also used to operate the digital accumulator 352, the quantizer 356, and the discrete-time integrator 236. Thus, the FLL is operated using $F_{ref}$ as described herein.

When operating in freeze mode, MUX 502B outputs a digital zero (e.g., from digital zero node 290). Thus, the discrete-time integrator 236 may temporarily hold the integrator output state. MUX 502C outputs the signal from oscillator 402 to be used for operating the digital accumulator 352, the quantizer 356, and the discrete-time integrator 236. MUX 502D may output the frequency-divided signal from the frequency divider 510 to the counter 112. The counter 112 then generates a count signal indicating a number of cycles of the oscillating signal from the VCO 212 in N cycles of the frequency-divided signal from the frequency divider 510. The period associated with N cycles of the frequency-divided signal is greater than the period of the signal from oscillator 402. Thus, generating the count signal using the frequency-divided signal may provide a more accurate frequency measurement. The generated count signal may be divided by N (e.g., where the signal from oscillator 402 is divided by N via the frequency divider 510) and used to determine and store $L_{freeze}$ and $\alpha_{freeze}$ in register 504. The divided count signal is also provided to combiner 204 (e.g., indirectly after encoding).

As described, $L_{freeze}$ and $\alpha_{freeze}$ are provided to the second input of MUX 502A. MUX 502A provides $L_{freeze}$ and $\alpha_{freeze}$ to combiner 204. The combiner 204 generates an error signal based on the target count signal (e.g., based on $L_{freeze}$ and $\alpha_{freeze}$) and the divided count signal from the counter 112. MUX 502B then outputs the error signal to the processing circuitry 201 for operating the FLL as described herein. In this manner, MUX 502C may be temporarily switched to operate using the output signal from oscillator 402 as opposed to $F_{ref}$.

In this manner, in an FLL circuit with a discrete-time integrator and a supplemental oscillator (e.g., an RCO) tuned roughly to the reference frequency of reference clock, a sequence of events may be performed using the supplemental oscillator before removing the reference clock, such that once the clock is removed, the FLL can maintain operating at a stable target frequency. This is achieved by first determining FLL control parameters associated with the supplemental oscillator when the FLL is operating at the target frequency. Then, when the reference clock is removed, these control parameters can be used together with the supplemental oscillator to maintain the FLL output frequency.

Example Operations

Figure 6:
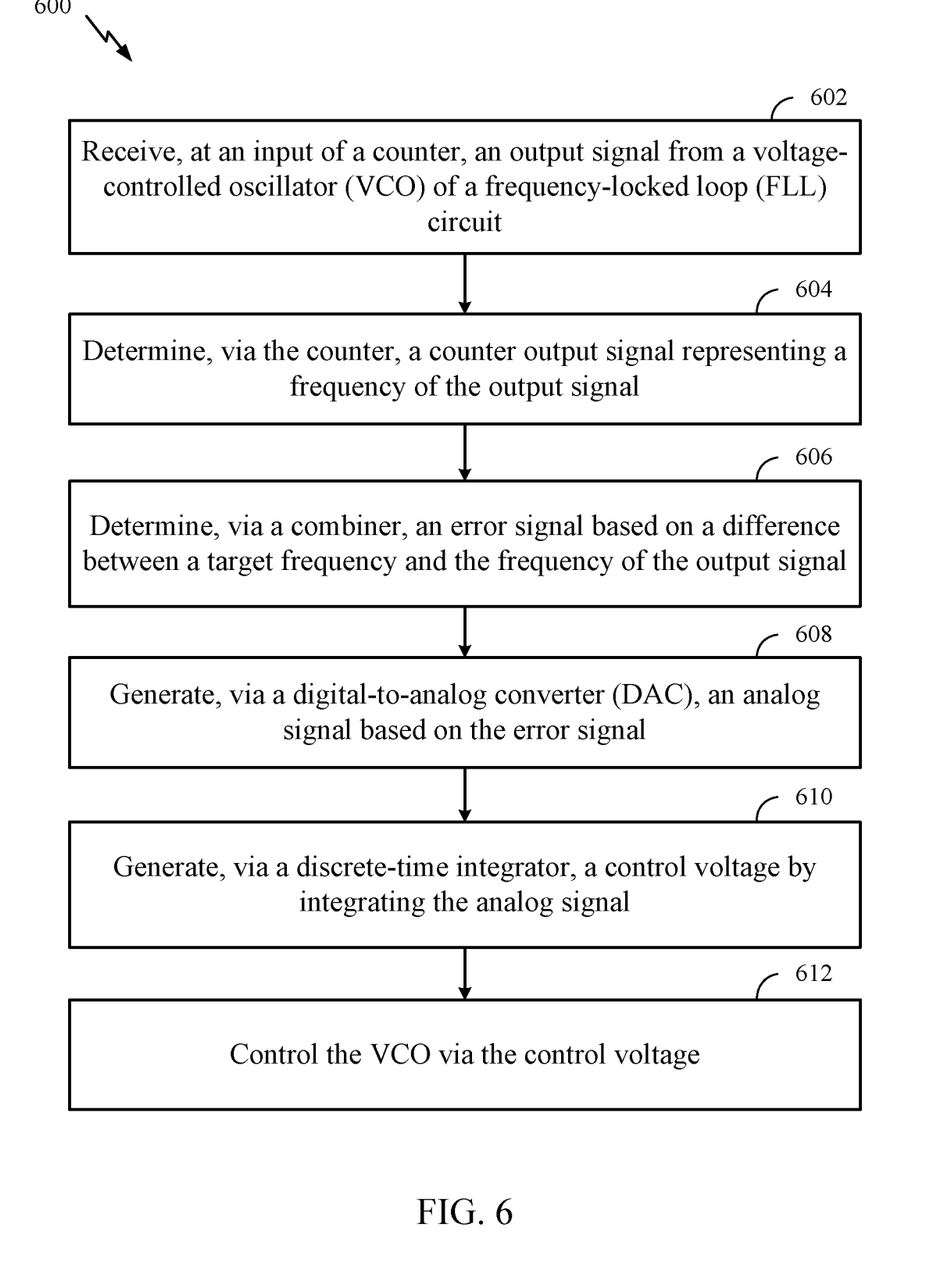
FIG. 6 is a flow diagram of example operations for signal generation, in accordance with certain aspects of the present disclosure.

FIG. 6 is a flow diagram illustrating example operations 600 for signal generation, in accordance with certain aspects of the present disclosure. The operations 600 may be performed via an FLL circuit, such as FLL 230, FLL circuit 300, FLL circuit 350, FLL circuit 400, or FLL circuit 500.

At block 602, the FLL circuit receives, at an input of a counter (e.g., the counter 112), an output signal from a VCO (e.g., VCO 212). At block 604, the FLL circuit determines, via the counter, a counter output signal representing a frequency of the output signal. At block 606, the FLL circuit determines, via a combiner (e.g., combiner 204), an error signal based on a difference between a target frequency and the frequency of the output signal. At block 608, the FLL circuit generates, via a DAC (e.g., DAC 234), an analog signal based on the error signal.

At block 610, the FLL circuit generates, via a discrete-time integrator, a control voltage (e.g., Vcntl used to control the VCO 212) by integrating the analog signal. In some aspects, the discrete-time integrator may be a switched-capacitor integrator (e.g., as described with respect to FIG. 3A). At block 612, the FLL circuit controls the VCO via the control voltage (e.g., to adjust the frequency of the oscillating signal).

In some aspects, the FLL circuit also selects (e.g., via MUX 502D and/or MUX 502C) a reference clock signal (e.g., $F_{ref}$) generated via a reference clock generator (e.g., reference clock generator 480) or a clock signal generated via an oscillator (e.g., oscillator 402). The counter output signal may be generated based on the selection. The oscillator may be a resistor-capacitor oscillator. The reference clock generator and the oscillator may be configured to generate signals with a similar frequency (e.g., within a 10% tolerance). In some aspects, the FLL circuit may store, in a register (e.g., register 504), an indication (e.g., $L_{freeze}$ and $\alpha_{freeze}$) of a state of the FLL circuit. In some aspects, the FLL circuit may select a set of target values (e.g., L and α) associated with a normal operation of the FLL circuit or the indication of the state of the FLL circuit stored in the register. The FLL may generate a target frequency signal (e.g., target count signal provided to the combiner 204) representing the target frequency based on the selection, the error signal being generated (e.g., via the combiner 204) based on the target frequency signal.

Example Aspects

In addition to the various aspects described above, specific combinations of aspects are within the scope of the present disclosure, some of which are detailed below:

Aspect 1: A frequency-locked loop (FLL) circuit comprising: an encoder; a combiner comprising a first input coupled to an output of the encoder; a digital-to-analog converter (DAC) comprising an input coupled to an output of the combiner; a discrete-time integrator comprising an input coupled to an output of the DAC; a voltage-controlled oscillator (VCO) comprising a control input coupled to an output of the discrete-time integrator; and a counter comprising an input coupled to an output of the VCO and comprising an output coupled to a second input of the combiner.

Aspect 2: The FLL circuit of Aspect 1, further comprising: a reference clock generator selectively coupled to a clock input of the counter; and an oscillator selectively coupled to the clock input of the counter.

Aspect 3: The FLL circuit of Aspect 2, wherein the oscillator comprises a resistor-capacitor oscillator.

Aspect 4: The FLL circuit of Aspect 2 or 3, wherein the reference clock generator and the oscillator are configured to generate signals with a same frequency within a 25% tolerance.

Aspect 5: The FLL circuit according to any of Aspects 2-4, further comprising a register including an input coupled to the output of the counter and configured to store an integer value and a fractional value of an output signal from the counter, when saving a state of the FLL circuit.

Aspect 6: The FLL circuit of Aspect 5, further comprising a multiplexer including a first set of inputs configured to receive a set of target values associated with a normal operation of the FLL circuit, including a second set of inputs coupled to outputs of the register, and including a set of outputs coupled to inputs of the encoder.

Aspect 7: The FLL circuit according to any of Aspects 1-6, further comprising a multiplexer including a first input coupled to the output of the combiner and including an output coupled to the input of the DAC.

Aspect 8: The FLL circuit of Aspect 7, wherein the multiplexer includes a second input configured to receive a digital signal having a value of zero.

Aspect 9: The FLL circuit according to any of Aspects 1-8, wherein the DAC has a resolution of no more than 3 bits.

Aspect 10: The FLL circuit according to any of Aspects 1-9, wherein the DAC is a 1-bit DAC.

Aspect 11: The FLL circuit according to any of Aspects 1-10, wherein the DAC comprises a charge pump.

Aspect 12: The FLL circuit according to any of Aspects 1-11, further comprising digital logic including an input coupled to the output of the combiner and including an output coupled to the input of the DAC.

Aspect 13: The FLL circuit of Aspect 12, wherein the digital logic comprises: a first coefficient multiplier including an input coupled to the output of the combiner; a digital accumulator including an input coupled to an output of the first coefficient multiplier; another combiner including a first input coupled to an output of the digital accumulator; a second coefficient multiplier including an input coupled to the output of the combiner and including an output coupled to a second input of the other combiner; and a re-quantizer including an input coupled to an output of the other combiner and including an output coupled to the input of the DAC.

Aspect 14: The FLL circuit of Aspect 13, wherein the output of the re-quantizer is a multi-bit output.

Aspect 15: The FLL circuit according to any of Aspects 1-14, wherein the discrete-time integrator comprises a switched-capacitor integrator.

Aspect 16: The FLL circuit of Aspect 15, wherein the switched-capacitor integrator comprises: an amplifier including a negative input, a positive input, and an output; a first capacitive element; a second capacitive element coupled between the output and the negative input of the amplifier; a first switch coupled between the input of the discrete-time integrator and a first terminal of the first capacitive element; a second switch coupled between the first terminal of the first capacitive element and the positive input of the amplifier; a third switch coupled between a second terminal of the first capacitive element and the negative input of the amplifier; a fourth switch coupled between the second terminal of the first capacitive element and the positive input of the amplifier; and a fifth switch coupled between the output of the amplifier and the output of the discrete-time integrator.

Aspect 17: A circuit for generating an oscillating signal, the circuit comprising: a frequency-locked loop (FLL) including a digital-to-analog converter (DAC), a discrete-time integrator having an input coupled to an output of the DAC, and a voltage-controlled oscillator (VCO) having a control input coupled to an output of the discrete-time integrator; a reference clock generator selectively coupled to one or more clock inputs of the FLL; and an oscillator selectively coupled to the one or more clock inputs of the FLL.

Aspect 18: The circuit of Aspect 17, wherein the oscillator comprises a resistor-capacitor (RC) oscillator.

Aspect 19: The circuit of Aspect 17 or 18, wherein the reference clock generator and the oscillator are configured to generate signals with a same frequency within a 25% tolerance.

Aspect 20: The circuit according to any of Aspects 17-19, further comprising a register including an input coupled to the FLL and configured to store an indication of a state of the FLL.

Aspect 21: A method of signal generation, comprising: receiving, at an input of a counter, an output signal from a voltage-controlled oscillator (VCO) of a frequency-locked loop (FLL) circuit; determining, via the counter, a counter output signal representing a frequency of the output signal; determining, via a combiner, an error signal based on a difference between a target frequency and the frequency of the output signal; generating, via a digital-to-analog converter (DAC), an analog signal based on the error signal; generating, via a discrete-time integrator, a control voltage by integrating the analog signal; and controlling the VCO via the control voltage.

Aspect 22: The method of Aspect 21, further comprising selecting a reference clock signal generated via a reference clock generator or a clock signal generated via an oscillator, wherein the counter output signal is generated based on the selection.

Aspect 23: The method of Aspect 22, wherein the oscillator comprises a resistor-capacitor oscillator.

Aspect 24: The method of Aspect 22 or 23, wherein the reference clock generator and the oscillator are configured to generate signals with a same frequency within a 25% tolerance.

Aspect 25: The method according to any of Aspects 21-24, further comprising storing, in a register, an indication of a state of the FLL circuit.

Aspect 26: The method of Aspect 25, further comprising: selecting a set of target values associated with a normal operation of the FLL circuit or the indication of the state of the FLL circuit stored in the register; and generating a target frequency signal representing the target frequency based on the selection, the error signal being generated based on the target frequency signal.

Aspect 27: The method of any of Aspects 21-26, wherein the discrete-time integrator comprises a switched-capacitor integrator.

Aspect 28: An apparatus for signal generation, comprising: means for determining a frequency indication signal representing a frequency of an output signal from a voltage-controlled oscillator (VCO) of a frequency-locked loop (FLL) circuit; means for determining an error signal based on a difference between a target frequency and the frequency of the output signal; means for generating an analog signal based on the error signal; and means for generating a control voltage, the means for generating the control voltage including means for integrating the analog signal in discrete time, the VCO being controlled via the control voltage.

Aspect 29: The apparatus of Aspect 28, further comprising means for selecting a reference clock signal generated via a reference clock generator or a clock signal generated via an oscillator, wherein the means for determining the frequency indication signal representing the frequency of the output signal from the VCO is controlled based on the selection.

Additional Considerations

The above description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components. For example, means for determining a frequency indication signal may include a counter, such as the counter 112. Means for determining an error signal may include a combiner, such as the combiner 204. Means for generating an analog signal may include a DAC, such as the DAC 234. Means for generating a control voltage or means for integrating may include a discrete-time integrator, such as the discrete-time integrator 236. Means for selecting may include a multiplexer, such as MUX 502A, 502B, 502C, or 502D.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. A frequency-locked loop (FLL) circuit comprising:
an encoder;
a combiner comprising a first input coupled to an output of the encoder;
a digital-to-analog converter (DAC) comprising an input coupled to an output of the combiner;
a discrete-time integrator comprising an input coupled to an output of the DAC;
a voltage-controlled oscillator (VCO) comprising a control input coupled to an output of the discrete-time integrator; and
a counter comprising an input coupled to an output of the VCO and comprising an output coupled to a second input of the combiner.

2. The FLL circuit of claim 1, further comprising:
a reference clock generator selectively coupled to a clock input of the counter; and
an oscillator selectively coupled to the clock input of the counter.

3. The FLL circuit of claim 2, wherein the oscillator comprises a resistor-capacitor oscillator.

4. The FLL circuit of claim 2, wherein the reference clock generator and the oscillator are configured to generate signals with a same frequency within a 25% tolerance.

5. The FLL circuit of claim 2, further comprising a register including an input coupled to the output of the counter and configured to store an integer value and a fractional value of an output signal from the counter, when saving a state of the FLL circuit.

6. The FLL circuit of claim 5, further comprising a multiplexer including a first set of inputs configured to receive a set of target values associated with a normal operation of the FLL circuit, including a second set of inputs coupled to outputs of the register, and including a set of outputs coupled to inputs of the encoder.

7. The FLL circuit of claim 1, further comprising a multiplexer including a first input coupled to the output of the combiner and including an output coupled to the input of the DAC.

8. The FLL circuit of claim 7, wherein the multiplexer includes a second input configured to receive a digital signal having a value of zero.

9. The FLL circuit of claim 1, wherein the DAC has a resolution of no more than 3 bits.

10. The FLL circuit of claim 1, wherein the DAC is a 1-bit DAC.

11. The FLL circuit of claim 1, wherein the DAC comprises a charge pump.

12. The FLL circuit of claim 1, further comprising digital logic including an input coupled to the output of the combiner and including an output coupled to the input of the DAC.

13. The FLL circuit of claim 12, wherein the digital logic comprises:
a first coefficient multiplier including an input coupled to the output of the combiner;
a digital accumulator including an input coupled to an output of the first coefficient multiplier;
another combiner including a first input coupled to an output of the digital accumulator;
a second coefficient multiplier including an input coupled to the output of the combiner and including an output coupled to a second input of the other combiner; and
a re-quantizer including an input coupled to an output of the other combiner and including an output coupled to the input of the DAC.

14. The FLL circuit of claim 13, wherein the output of the re-quantizer is a multi-bit output.

15. The FLL circuit of claim 1, wherein the discrete-time integrator comprises a switched-capacitor integrator.

16. The FLL circuit of claim 15, wherein the switched-capacitor integrator comprises:
an amplifier including a negative input, a positive input, and an output;
a first capacitive element;
a second capacitive element coupled between the output and the negative input of the amplifier;
a first switch coupled between the input of the discrete-time integrator and a first terminal of the first capacitive element;
a second switch coupled between the first terminal of the first capacitive element and the positive input of the amplifier;
a third switch coupled between a second terminal of the first capacitive element and the negative input of the amplifier;
a fourth switch coupled between the second terminal of the first capacitive element and the positive input of the amplifier; and
a fifth switch coupled between the output of the amplifier and the output of the discrete-time integrator.

17. A circuit for generating an oscillating signal, the circuit comprising:
a frequency-locked loop (FLL) including a digital-to-analog converter (DAC), a discrete-time integrator having an input coupled to an output of the DAC, and a voltage-controlled oscillator (VCO) having a control input coupled to an output of the discrete-time integrator;
a reference clock generator selectively coupled to one or more clock inputs of the FLL; and
an oscillator selectively coupled to the one or more clock inputs of the FLL.

18. The circuit of claim 17, wherein the oscillator comprises a resistor-capacitor (RC) oscillator.

19. The circuit of claim 17, wherein the reference clock generator and the oscillator are configured to generate signals with a same frequency within a 25% tolerance.

20. The circuit of claim 17, further comprising a register including an input coupled to the FLL and configured to store an indication of a state of the FLL.

21. A method of signal generation, comprising:
receiving, at an input of a counter, an output signal from a voltage-controlled oscillator (VCO) of a frequency-locked loop (FLL) circuit;
determining, via the counter, a counter output signal representing a frequency of the output signal;
determining, via a combiner, an error signal based on a difference between a target frequency and the frequency of the output signal;
generating, via a digital-to-analog converter (DAC), an analog signal based on the error signal;
generating, via a discrete-time integrator, a control voltage by integrating the analog signal; and
controlling the VCO via the control voltage.

22. The method of claim 21, further comprising selecting a reference clock signal generated via a reference clock generator or a clock signal generated via an oscillator, wherein the counter output signal is generated based on the selection.

23. The method of claim 22, wherein the oscillator comprises a resistor-capacitor oscillator.

24. The method of claim 22, wherein the reference clock generator and the oscillator are configured to generate signals with a same frequency within a 25% tolerance.

25. The method of claim 21, further comprising storing, in a register, an indication of a state of the FLL circuit.

26. The method of claim 25, further comprising:
selecting a set of target values associated with a normal operation of the FLL circuit or the indication of the state of the FLL circuit stored in the register; and
generating a target frequency signal representing the target frequency based on the selection, the error signal being generated based on the target frequency signal.

27. The method of claim 21, wherein the discrete-time integrator comprises a switched-capacitor integrator.

28. An apparatus for signal generation, comprising:
means for determining a frequency indication signal representing a frequency of an output signal from a voltage-controlled oscillator (VCO) of a frequency-locked loop (FLL) circuit;
means for determining an error signal based on a difference between a target frequency and the frequency of the output signal;
means for generating an analog signal based on the error signal; and
means for generating a control voltage, the means for generating the control voltage including means for integrating the analog signal in discrete time, the VCO being controlled via the control voltage.

29. The apparatus of claim 28, further comprising means for selecting a reference clock signal generated via a reference clock generator or a clock signal generated via an oscillator, wherein the means for determining the frequency indication signal representing the frequency of the output signal from the VCO is controlled based on the selection.

* * * * *